United States Patent [19]

Kinoshita et al.

[11] Patent Number: 4,513,313

[45] Date of Patent: Apr. 23, 1985

[54] SOLID STATE IMAGING DEVICE

[75] Inventors: Takao Kinoshita, Tokyo; Shinji Sakai, Yokohama, both of Japan

[73] Assignee: Canon Kabushiki Kaisha, Tokyo, Japan

[21] Appl. No.: 474,048

[22] Filed: Mar. 10, 1983

[30] Foreign Application Priority Data

Dec. 7, 1982 [JP] Japan .............................. 57-214411
Dec. 10, 1982 [JP] Japan .............................. 57-216391

[51] Int. Cl.³ .................... H04N 9/07; H04N 3/14; H01L 29/78; G11C 19/28
[52] U.S. Cl. .................................. 358/44; 357/24; 358/213; 365/183; 365/219; 377/62
[58] Field of Search .................. 358/44, 48; 357/24, 357/24 LR; 377/61, 62; 365/183, 219, 238

[56] References Cited

U.S. PATENT DOCUMENTS

| | | | |
|---|---|---|---|
| 3,971,003 | 7/1976 | Kosonocky | 340/173 |
| 4,001,878 | 1/1977 | Weimer | 358/41 |
| 4,199,691 | 4/1980 | Angle | 307/221 |
| 4,211,936 | 7/1980 | Kosonocky et al. | 307/221 |
| 4,237,383 | 12/1980 | Kosonocky et al. | 250/578 |

Primary Examiner—John C. Martin
Assistant Examiner—Randall S. Svihla
Attorney, Agent, or Firm—Fitzpatrick, Cella, Harper & Scinto

[57] ABSTRACT

Disclosed is a solid state imaging device which comprises an imaging unit having a plurality of picture cells arranged in at least one line for producing electrical information in response to incident radiation; a read-out unit for reading out said electrical information from said imaging unit, said read-out unit including m separate read-out channels, where m is an integer no smaller than three; and an input unit for dividing the electrical information in one line of said imaging unit into m groups, parallel-to-serial converting the respective groups of electrical information and supplying the serial information to said read-out unit.

66 Claims, 14 Drawing Figures

SOLID STATE IMAGING DEVICE

BACKGROUND OF THE INVENTION

1. Field of the Invention

The present invention relates to a solid state imaging device, and more particularly to a solid state imaging device suitable to produce a color image signal.

2. Description of the Prior Art

In the prior art, when a color image signal with three or more color signals is to be produced by one or two solid state imaging devices, image sensing parts of the imaging devices receive light through color separating optical members such as color filters arranged in stripe or mosaic to form electrical information representative of the respective colors in picture cells and the electrical information of the picture cells are time-serially read out through a common transfer path.

FIG. 1 shows an example of a well-known prior art solid state imaging device which utilizes a frame transfer (FT) type charge coupled device (CCD).

In FIG. 1, numeral 1 denotes an image sensing part having a plurality of photo-electric converting picture cells arranged in rows and columns. Numeral 2 denotes a memory part for storing charge information of the picture cells of thee image sensing part 1. Numeral 3 denotes a horizontal register which functions as a read transfer path. It reads out the information of the memory part 2 one horizontal line at a time and transfers the line information horizontally to time-serially produce point-sequential signals.

By arranging color separating stripe color filters as shown in FIG. 2 in front of the imaging part 1 with the pitch of the color filters R (red), G (green) and B (blue) being coincident with the pitch of the picture cells of the image sensing part 1, the picture cells in the respective columns produce signals representative of the respective colors and the point-sequential color signals are time-serially produced from the horizontal shift register 3.

The color signals thus produced are converted to, for example, an NTSC signal by a signal processing circuit as shown in FIG. 3.

The point-sequential image output signals from a CCD amplifier 4 are sampled and held by a signal separation circuit 8 comprising three sample-and-hold circuits 5, 6 and 7 so that a red signal $E_R$, a green signal $E_G$ and a blue signal $E_B$ are separated. The color signals $E_R$, $E_G$ and $E_B$ are level-adjusted by variable gain amplifiers 9, 10 and 11, respectively, so that a white balance is controlled. The level-adjusted color signals are than processed by processing circuits 12, 13 and 14 each including a clamp circuit, a $\gamma$ correction circuit and an aperture correction circuit, and the signals are converted to a luminance signal and two color difference signals by a matrix circuit 15, and they are converted to the NTSC signal by an encoder 16.

With such an arrangement, the horizontal register 3 sequentially reads out three primary colors. In order to read them with a carrier of 3.58 MHz, a clock of 3.58 MHz$\times 3 = 10.74$ MHz is required. However, as the clock frequency is high, the transfer efficiency is reduced and the power consumption increases. As a result, a problem is encountered when the number of picture cells of the horizontal shift register or the number of horizontal picture cells of the image sensing part 1 is large.

SUMMARY OF THE INVENTION

It is an object of the present invention to provide a solid state imaging device suitable for color imaging, which overcomes the difficulties encountered in the prior art solid state imaging device.

It is another object of the present invention to provide a color imaging device which separates color signals to produce the color signals directly.

It is an other object of the present invention to provide a solid state imaging device which has reduced noise, is capable of driving a horizontal register at a low rate and has a high transfer efficiency.

It is a further object of the present invention to provide a solid state imaging device which allows a significant increase of the number of horizontal picture cells and significantly improves horizontal resolution.

In accordance with a feature of the present invention, there is provided a solid state imaging device comprising imaging means having a plurality of picture cells arranged in rows and columns for producing electrical information in response to incident radiation, readout means having m (m≧3) read sections for reading the electrical information produced by the imaging means and input means for dividing one row of information in the imaging means into m groups and reading the information by parallel-to-serial conversion for each group.

In accordance with another feature of the present invention, controllable isolate means for isolating the read sections from each other in shifting the information in the read sections is additionally provided. In this manner, the information can be synchronously read from the m read sections.

The solid state imaging device of the present invention is suitable for color imaging. In accordance with still another feature of the present invention which takes a combination of color separating optical members and the solid state imaging device into consideration, there is provided a solid state imaging device comprising imaging means for receiving incident light through a color separating optical means which separates the incident light into a plurality of color light components to produce electrical information representative of the respective color light components, readout means having a plurality of read sections for reading the electrical information produced by the imaging means and input means for classifying one row of electrical information in the imaging means to the respective color information and supplying it to the readout means while converting it by parallel-to-serial conversion.

Again, isolate means for isolating the read sections from each other in shifting the information in the read sections may be additionally provided so that the color signals can be synchronously read out.

In accordance with the present invention, the solid-state imaging device is characterized by the input means. Considering particularly the solid-state imaging device comprising the imaging means having the plurality of picture cells arranged in rows and columns to produce the electrical information representative of the incident light, the readout means having the m read sections for reading the electrical information produced by the imaging means and input means for dividing the arrangement in the imaging means into m groups with respect to the columns and supplying the electrical information to the readout means while converting it by parallel-to-serial conversion for each group, the input means is arranged between the imaging means and the readout means and transfers the information of the respective column groups while imparting different delays to the m picture cell column groups of the imaging means so that the information of the respective column groups are supplied to the corresponding read sections.

In a specific embodiment, when m is three, the input means transfers the information while it imparts zero picture cell or zero bit of delay to the information of the first column group, one picture cell or one bit of delay to the information of the second column group and two picture cells or two bits of delay to the information of the third column group so that the information of the respective column groups are supplied to the corresponding read sections.

In other words, the input means is constructed to have a function of parallel-to-serial conversion.

The read sections, when imparted with the different delays, read the information of the corresponding column groups sent at the different timings.

The other objects and features of the present invention will be apparent from the description of the preferred embodiments of the invention taken in conjunction with the accompanying drawings.

DETAILED DESCRIPTION OF THE PREFERRED EMBODIMENTS

Figure 1:
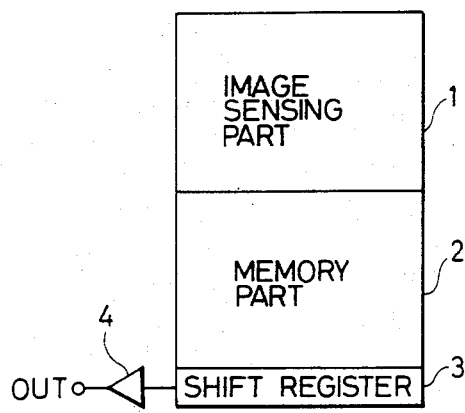
FIG. 1 shows a configuration of a prior art frame transfer type CCD.
Figure 2:
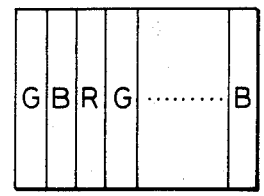
FIG. 2 shows an example of a stripe color filter.
Figure 3:
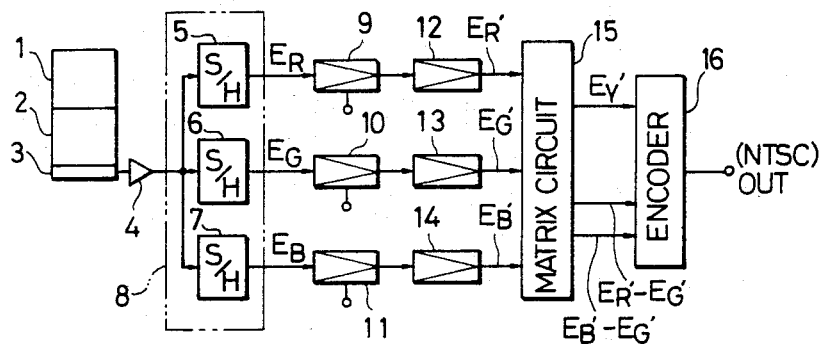
FIG. 3 shows a configuration of a prior art color image signal processing circuit.
Figure 4:
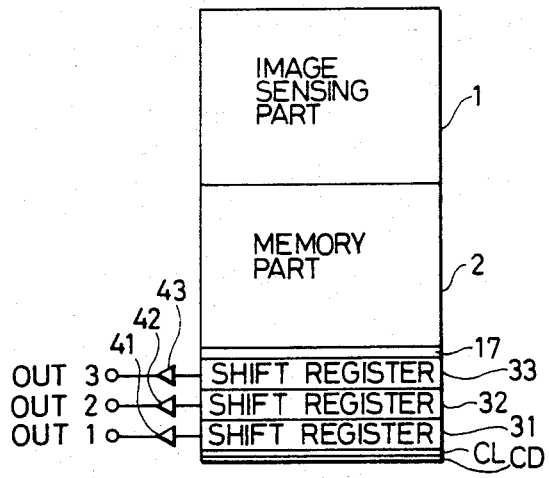
FIG. 4 shows one embodiment of a solid state imaging device of the present invention.

One embodiment of the present invention is shown in FIG. 4 in which the like numerals to those shown in FIGS. 1 to 3 denote the like elements or like functional means.

In FIG. 4, a color stripe filter for color separation as shown in FIG. 2 is arranged in front of the image sensing part 1. Numerals 31, 32 and 33 denote horizontal shift registers which function as horizontal read sections, numerals 41, 42 and 43 denote charge voltage conversion amplifiers, and numeral 17 denotes separating input section arranged between the memory part 2 and the three horizontal shift registers 31–33 for distributing three color information contained in the last horizontal line of the memory part 2 to the corresponding one of the three horizontal shift registers 31–33 to parallel-to-serial convert the charges.

In the present embodiment, three horizontal shift registers 31–33 are provided, one for each of the color signals to be produced, as the read transfer path and the charges representative of the respective colors are distributed to the respective horizontal shift registers 31, 32 and 33 to read out the information.

Accordingly, the respective color signals are essentially sampled by the horizontal registers 31, 32 and 33 and the amplifiers 41, 42 and 43 produce the separated color signals.

A charge clear drain CD is arranged at the lowermost end of the imaging device, that is, under a charge clear gate CL adjacent to the horizontal shift register 31. The drain CD is connected to a power supply level.

Figure 5:
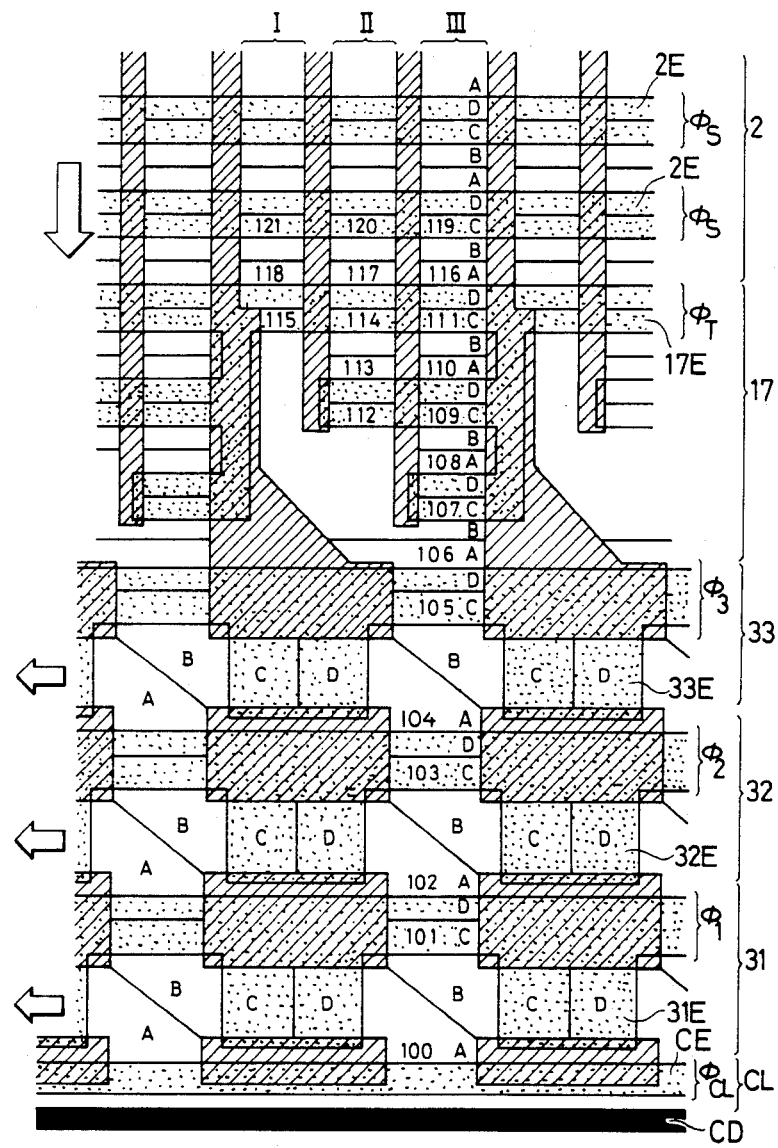
FIG. 5 shows detail of the device of FIG. 4, FIGS. 6(a), 6(b) and 6(c) show a vertical transfer timing and a horizontal transfer timing of the device.

FIG. 5 shows an electrode structure of the imaging device of FIG. 4. It shows a lower end of the memory part 2 to the three horizontal shift registers 31–33.

Hatched areas show channel stops, numerals 31E–33E denote transfer electrodes of the horizontal shift registers 31–33, numeral 17E denotes a transfer electrode of the separating input section 17 and numeral 2E denotes a transfer electrode of the memory parts 2.

While the present embodiment shows a single-phase driven transfer, two-phase, three-phase or even four-phase driven transfer may be used.

A set of portions A, B, C and D form a unit cell and potentials of the portions A–D are represented by P(A)–P(D). Virtual electrodes are formed by ion injection such that P(A)>P(B) and potential levels are fixed. Potentials of the portions C and D under the transfer electrodes are set such that P(C)>P(D). When low level potentials are applied to the respective electrodes, a relation of P(A)>P(B)>P(C)>P(D) is met, and when high level potentials are applied, a relation of P(C)>P(D)>P(A)>P(B) is met. It is of opposite relation to that of the potentials P(A)–P(D).

$\phi 1$–$\phi 3$ denote clock pulses applied to the electrodes 31E–33E, $\phi T$ denotes a clock pulse applied to the electrode 17E, $\phi S$ denotes a clock pulse applied to the electrode 2E and $\phi CL$ denotes a clock pulse applied to the electrode CE of the clear gate CL.

Figure 6A:
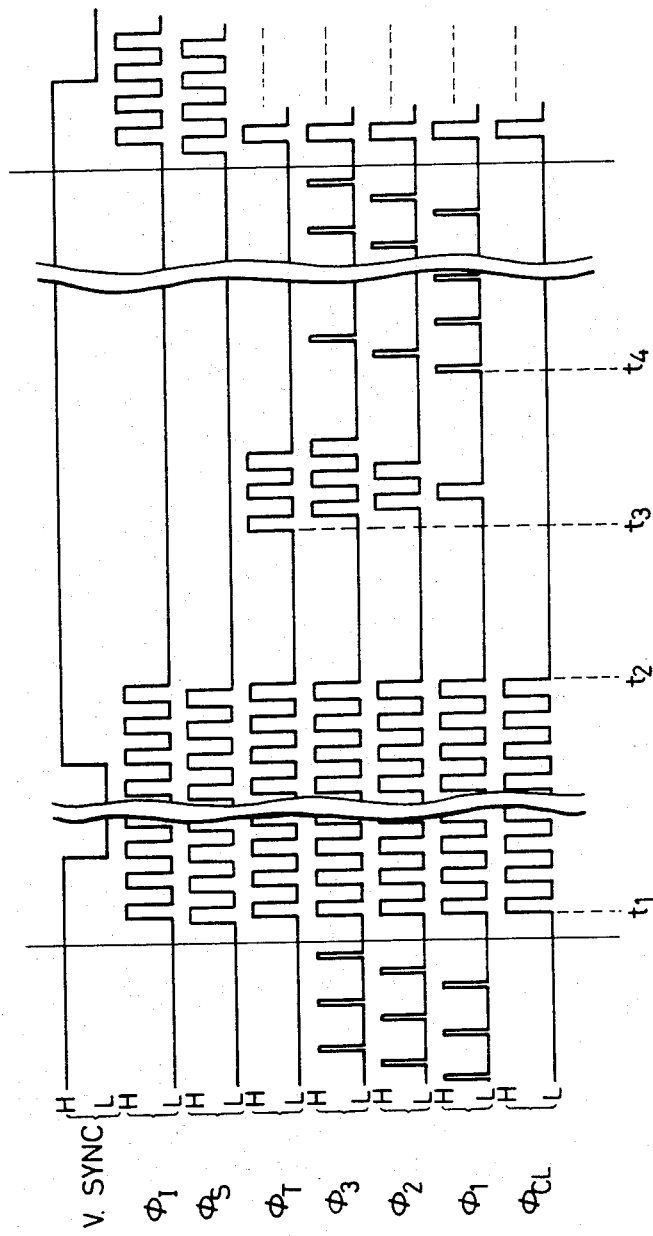
Figure 6B:
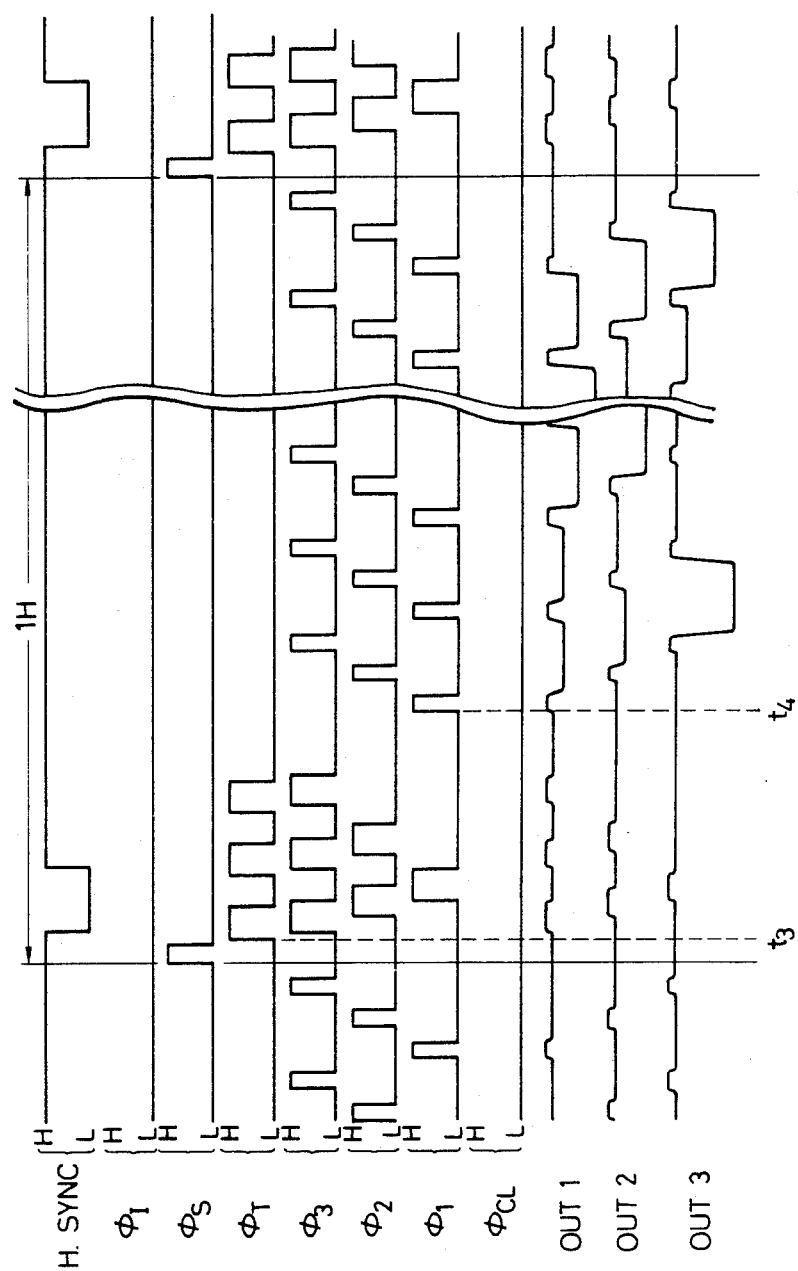

FIGS. 6(a) and 6(b) show a vertical transfer clock timing and a horizontal transfer timing, respectively.

Figure 7:
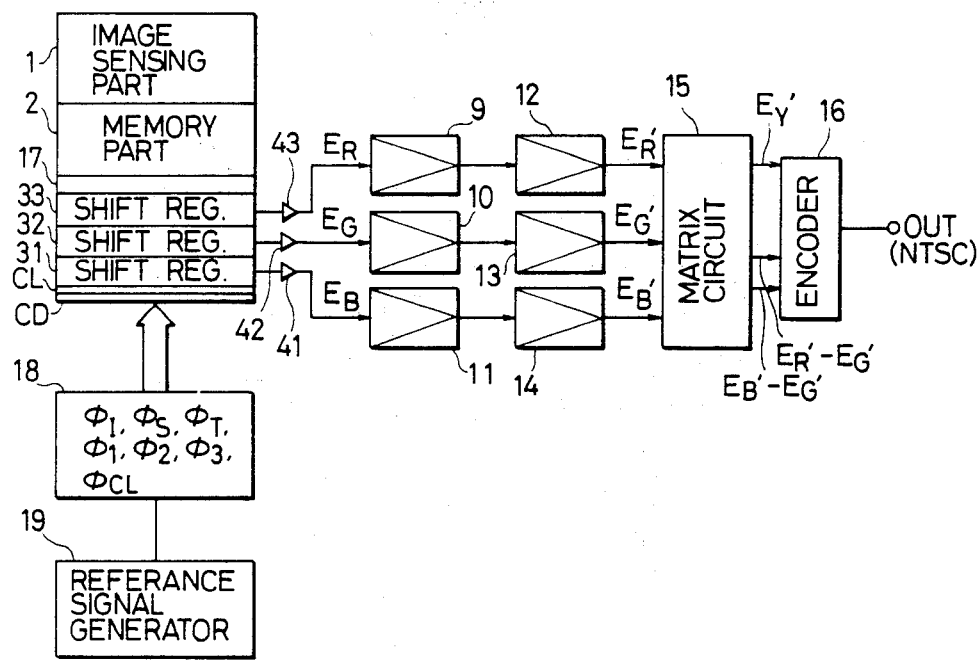
FIG. 7 shows a configuration of a color imaging system which uses the above device.

FIG. 7 shows a block diagram of a color imaging system which uses the imaging device of the present invention. Numeral 18 denotes a driver which functions as control means and supplies the clock pulses $\phi I$, $\phi S$, $\phi T$, $\phi 1$, $\phi 2$, $\phi 3$ and $\phi CL$ as shown in FIGS. 6(a) and 6(b). $\phi I$ denotes the clock pulse applied to the electrode of the image sensing part 1. Numeral 19 denotes a reference signal generator. The like numerals to those shown in FIG. 3 denote the like elements. As seen from FIG. 7, the present embodiment omits the sample and hold circuit for separating the color information so that the circuit configuration is simplified.

The operation of the configuration shown in FIG. 5 is explained. In the vertical transfer of the charges from the image sensing part 1 to the memory part 2 as shown in FIG. 6(a), synchronized clock pulses of substantially the same phase (except the clock pulse $\phi S$ which slightly leads to the other clock pulses as shown), which are equal in number to at least the number of vertical picture cells of the image sensing area 1 are supplied in synchronism with a vertical synchronizing signal V.SYNC during a time period $t_1$–$t_2$ as the clock pulses $\phi I$, $\phi S$, $\phi T$, $\phi 3$, $\phi 2$, $\phi 1$ and $\phi CL$ so that the charges remaining in the memory part 2 are drained to the clear drain CD through the horizontal registers 33, 32 and 31 and the clear gate CL and the charges in the image sensing part 1 are transferred to the memory part 2 and stored therein. At and after time $t_3$, the clock pulses $\phi T$, $\phi 3$, $\phi 2$ and $\phi 1$ are supplied as shown so that the horizontal information in the last line of the memory part 2 are distributed to the three horizontal shift registers 31-33 through the separating input section 17, and at and after time $t_4$, the information in the horizontal registers 31, 32 and 33 are sequentially read out by supplying the clock pulses $\phi_1$, $\phi_2$ and $\phi_3$ to the horizontal registers 31-33 as shown.

Regarding the information in the next and following lines of the memory part 2, the clock pulse $\phi S$ is applied immediately before the time $t_3$ to shift one line of information to be read to the last line of the memory part 2 and then the above operation is repeated (FIG. 6(b)).

The operation during the time period $t_3$-$t_4$, that is, the operation to distribute the information in the last line of the memory part 2 to the three horizontal shift registers 31-33 through the separating input section 17 is now explained in detail with reference to FIGS. 5, 6(a) and 6(b). For the sake of simplification, the shift of the charge information in only three columns I, II and III of the memory part 2 shown in FIG. 5 is explained although the same operations are carried out for the columns of other three-column sets.

At time $t_3$, the clock pulse $\phi T$ assumes a high level in substantial synchronism with the horizontal synchronizing signal H.SYNC and the charges stored in the portions 116, 117 and 118 in the last line of the memory part 2 are shifted to portions 111, 114 and 115 in the separating input section 17. When the clock pulse $\phi T$ thereafter assumes a low level, the charges in the portions 111, 114 and 115 are shifted to portions 110, 113 and 106, respectively. When the clock pulses $\phi_3$, $\phi_2$ and $\phi_1$ are sequentially applied slightly later than the clock pulse $\phi T$, the charge in the portion 106 of the separating input section 17, that is, the charge initially stored in the portion 118 in the column I of the memory part 2 is shifted to a portion 100 of the horizontal register 31 through portions 105 and 104 of the horizontal register 33, portions 103 and 102 of the horizontal register 32 and a portion 101 of the horizontal register 31 and stored in the portion 100 of the horizontal register 31.

When the clock pulse $\phi T$ is again applied, the charges in the portions 110 and 113 of the separating input section 17 are shifted to the portions 108 and 106 through the portions 109 and 112. When the clock pulses $\phi_3$ and $\phi_2$ are sequentially applied slightly later than the clock pulse $\phi T$, the charge in the portion 106 of the separating input section 17, that is, the charge initially stored in the portion 117 in the column II of the memory part 2 is shifted to the portion 102 of the horizontal register 32 through the portions 105, 104 and 103 and stored in the portion 102.

When the clock pulse $\phi T$ is again applied, the charge in the portion 108 of the separating input section 17 is shifted to the portion 106 through the portion 107. When the clock pulse $\phi_3$ is applied slightly later than the clock pulse $\phi T$, the charge in the portion 106 of the separating input section 107, that is, the charge initially stored in the portion 116 in the column III of the memory part 2 is shifted to the portion 104 of the horizontal register 33 through the portion 105 and stored therein.

In this manner, the charges stored in the last line of the memory part 2 are distributed to the groups of the columns I, II and III through the separating input part 17. Thus, if the R, G and B stripe filters are arranged such that the R stripe filter corresponds to the column I group, the G stripe filter corresponds to the column II group and the B stripe filter corresponds to the column III group, the charges corresponding to R, G and B are stored in the horizontal registers 31, 32 and 33, respectively.

At and after the time $t_4$, the charges stored in the horizontal registers 31, 32 and 33 are read out (OUT1-OUT3 in FIG. 6(b)).

When the charges in one horizontal line of the memory part 2 have been read out through the horizontal registers 21-33, the clock pulse $\phi S$ is applied to the memory part 2 as shown in FIG. 6(b) and the charges stored in the respective horizontal lines are vertically shifted by one horizontal line so that new charges are stored in the last line, and then the operation of the time period $t_3$-$t_4$ is carried out to distribute the new last line of charges to the horizontal registers 31-33.

By repeating the above operations, the charges stored in the respective lines of the memory part 2 are separated to the respective colors and then read out.

Figure 6C:
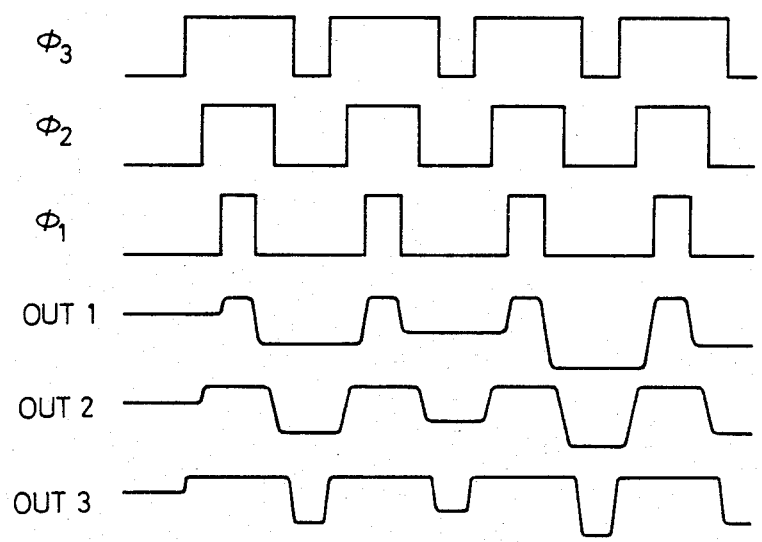

In order to prevent the charges of the registers 31, 32 and 33 from being mixed when the charges of the horizontal registers 31-33 are horizontally shifted, control gates for isolating the registers 31, 32 and 33 from each other in a horizontal charge transfer mode may be additionally provided as shown in another embodiment to be described later, or the waveforms of the clock pulses $\phi_1$, $\phi_2$ and $\phi_3$ in the horizontal transfer mode may be slightly modified so that the charges are horizontally transferred without being mixed among the horizontal registers 31-33 without adding the isolating means. For example, at the time $t_4$, the clock pulse $\phi_3$ is set to the high level in advance to the clock pulses $\phi_2$ and $\phi_1$ to shift the charge stored in the portion 104 of the horizontal register 33 to the portion corresponding to C under the left adjacent electrode 33E, and the clock pulse $\phi_2$ is then set to the high level while keeping the clock pulse $\phi_3$ at the high level to shift the charge stored in the portion 102 of the horizontal register 32 to the portion corresponding to C under the left adjacent electrode 32E, and the clock pulse $\phi_1$ is then set to the high level while keeping the clock pulses $\phi_3$ and $\phi_2$ at the high level to shift the charge stored in the portion 100 of the horizontal register 31 to the portion corresponding to C under the left adjacent electrode 31E, and the clock pulse $\phi_1$ is then set to the low level in advance to the clock pulses $\phi_2$ and $\phi_3$ to shift the charge stored in the portion corresponding to C under the electrode 31E of the horizontal register 31 to the portion corresponding to A on the left side thereof, and the clock pulse $\phi_2$ is then set to the low level to shift the charge stored in the portion corresponding to C under the electrode 32E of the horizontal register 32 to the left adjacent portion, and the clock pulse $\phi_3$ is then set to the low level to shift the charge stored in the portion corresponding to C under the electrode 33E of the horizontal register 33 to the portion corresponding to A on the left side thereof. In this manner, the transfer of the charges from the portions A to the portions C is carried out sequentially from the horizontal register 33 through the horizontal register 32 to the horizontal register 31, and the transfer of the charges from the portions C to the portions A is carried out in the opposite sequence from the horizontal register 31 through the horizontal register 32 to the horizontal register 33. Thus, the charges are horizontally transferred without being mixed among the horizontal registers 31-33 without the additional isolating means. The clock pulses $\phi_1$, $\phi_2$ and $\phi_3$ and the three outputs derived are shown in FIG. 6(c).

Another embodiment of the present invention is now explained. As described above, in the present embodiment, controllable isolate sections for isolating the horizontal registers 31, 32 and 33 from each other in the horizontal charge transfer mode are additionally provided.

Figure 8:
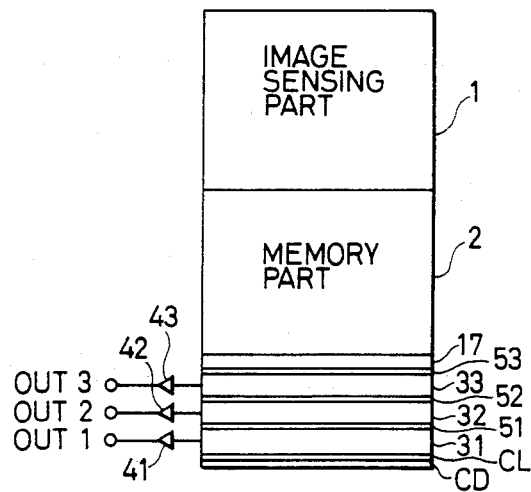
FIG. 8 shows another embodiment of the solid state imaging device of the present invention.
Figure 9:
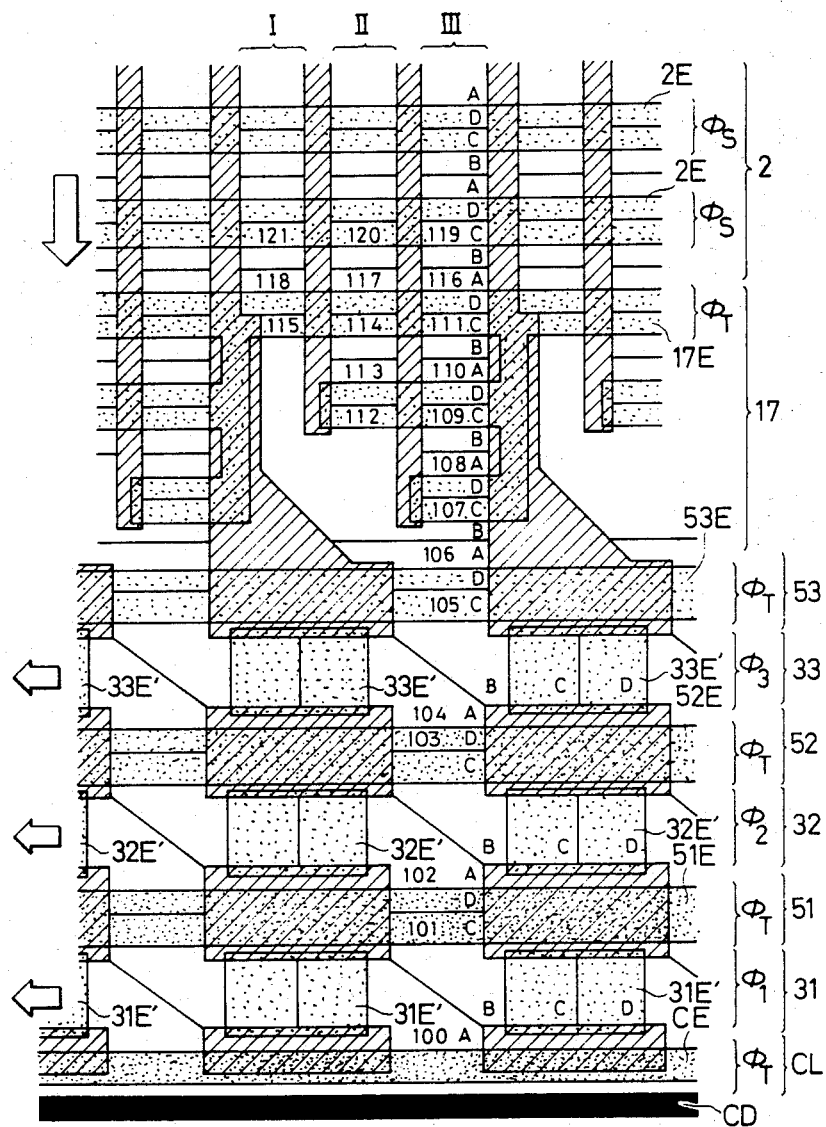
FIG. 9 shows detail of the device of FIG. 8, FIGS. 10(a) and 10(b) show a vertical transfer timing and a horizontal transfer timing of the device of FIG. 8.

Referring to FIG. 8, the like numerals to those shown in the previous drawings designate the like elements. Numerals 51, 52 and 53 denote controllable isolate sections associated with the horizontal registers 31, 32 and 33 to isolate the horizontal registers 31, 32 and 33 from each other in the horizontal charge transfer mode of the horizontal shift registers 31, 32 and 33. More particularly, they are constructed as shown in FIG. 9, in which mumerals 51E, 52E and 53E denote control electrodes of the isolate sections 51, 52 and 53, respectively, to which the clock pulse $\phi T$ is applied. In the present embodiment, transfer electrodes 31E', 32E' and 33E' of the horizontal shift registers 31, 32 and 33 are separated in the respective horizontal registers 31, 32 and 33 as shown although they are connected in common for each of the horizontal registers 31, 32 and 33 by well-known means such as Al substrate.

While the present embodiment shows a single-phase drive, two-phase, three-phase or even four-phase drive may be used.

The other portions are identical to the previous embodiment. A color imaging system which utilizes the imaging device of the present invention may be constructed in the same manner as shown in FIG. 7.

Figure 10A:
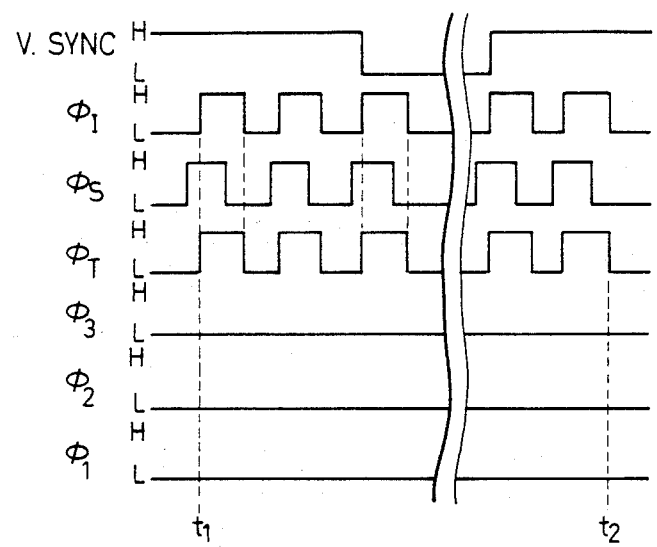

The operation of the present embodiment is now explained. As shown in FIG. 10(a), in the vertical transfer mode of the charges from the image sensing part 1 to the memory part 2, synchronous clock pulses of essentially the same phase (except the clock pulse $\phi S$ which slightly leads the other clock pulses) which are equal in number to at least the number of vertical picture cells in the image sensing part 1 are supplied as the clock pulses $\phi I$, $\phi S$ and $\phi T$ during the time period $t_1-t_2$ in substantial synchronism with the vertical synchronizing signal V.SYNC so that the charges remaining in the memory part 2 are drained to the clear drain CD through the isolate sections 51–53, the horizontal registers 31–33 and the clear gate CL and the charges in the image sensing part 1 are transferred to the memory part 2 and stored therein. Then, as shown in FIG. 10(b), at and after the time $t_3$, the clock pulse $\phi T$ is supplied as shown to distribute the horizontal information in the last line of the memory part 2 to the separating input section 17, the isolate sections 51–53 and the horizontal shift registers 31–33, and at and after the time $t_4$, the clock pulses $\phi_1$, $100_2$ and $\phi_3$ are applied to the horizontal registers 31, 32 and 33 as shown to sequentially read out the information.

Figure 10B:
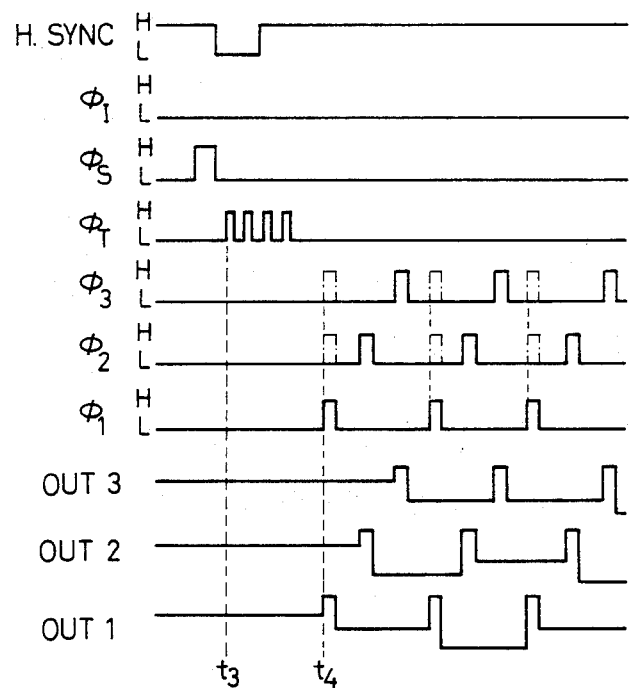

Regarding the information in the next and following lines of the memory part 2, the clock pulse $\phi S$ is applied immediately before the time $t_3$ to shift one line of information to be read to the last line of the memory part 2 and then the above operation is repeated (FIG. 10(b)).

The operation during the time period $t_3-t_4$, that is, the operation to distribute the information in the last line of the memory part 2 to the three horizontal shift registers 31–33 through the separating input section 17 and the isolate sections 51–53 is now explained in detail with reference to FIGS. 9 and 10(b). For the sake of simplification, the shift of the charge information in only three columns I, II and III of the memory part 2 shown in FIG. 9 is explained although the same operations are carried out for the columns of other three-column sets.

At time $t_3$, the clock pulse $\phi T$ assumes a high level in substantial synchronism with the horizontal synchronizing signal H.SYNC and the charges stored in the portions 116, 117 and 118 in the last line of the memory part 2 are shifted to portions 111, 114 and 115 in the separating input section 17. When the clock pulse $\phi T$ thereafter assumes a low level, the charges in the portions 111, 114 and 115 are shifted to portions 110, 113 and 106, respectively. When the second clock pulse $\phi T$ is applied, the charge in the portion 106 of the separating input section 17, that is, the charge initially stored in the portion 118 in the column I of the memory part 2 is shifted to the portion 104 of the horizontal register 33 through the portion 105 of the isolate section 53, and the charges stored in the portions 110 and 113 of the separating input section 17 are shifted to the portions 108 and 106 through the portions 109 and 112, respectively. When the third clock pulse $\phi T$ is applied, the charge in the portion 104 of the horizontal register 33 is shifted to the portion 102 of the horizontal register 32 through the portion 103 of the isolate section 52, and the charge in the portion 106 of the separating input section 17, that is, the charge initially stored in the portion 117 in the column II of the memory part 2 is shifted to the portion 104 of the horizontal register 33 through the portion 105 of the isolate section 53. The charge in the portion 108 of the separating input section 17 is shifted to the portion 106 through the portion 107. When the fourth clock pulse $\phi T$ is applied, the charge in the portion 102 of the horizontal register 32 is shifted to the portion 100 of the horizontal register 31 through the portion 101 of the isolate section 51 and stored therein, and the charge in the portion 104 of the horizontal register 33 is shifted to the portion 102 of the horizontal register 32 through the portion 103 of the isolate section 52 and stored therein. The charge in the portion 106 of the separating input section 17, that is, the charge initially stored in the portion 116 in the column III of the memory part 2 is shifted to the portion 104 of the horizontal register 33 through the portion 105 of the isolate section 53 and stored therein.

In this manner, the charges stored in the last line of the memory part 2 are distributed to the shift registers 31–33 in the groups of the columns I, II and III through the separating input part 17. Thus, if the R, G and B stripe filters are arranged such that the R stripe filter corresponds to the column I group, the G stripe filter corresponds to the column II group and the B stripe filter corresponds to the column III group, the charges corresponding to R, G and B are stored in the horizontal registers 31, 32 and 33, respectively.

At and after the time $t_4$, the charges in the horizontal registers 31, 32 and 33 are read out by applying the clock pulses $\phi_1-\phi_2$. Since the clock pulse $\phi T$ is kept at the low level at this time, the isolate sections 51–53 function as barriers so that the mixing of the charges among the horizontal registers 31, 32 and 33 in the horizontal transfer of the charges in the horizontal registers 31, 32 and 33 is prevented.

When the charges in one horizontal line of the memory part 2 have been read out through the horizontal registers 31–33, the clock pulse $\phi S$ is applied to the memory part 2 as shown in FIG. 10(b) and the charges stored in the respective horizontal lines are vertically shifted by one horizontal line so that new charges are stored in the last line, and then the operation of the time period $t_3-t_4$ is carried out to distribute the new last line of charges to the horizontal registers 31–33.

By repeating the above operations, the charges stored in the respective lines of the memory part 2 are separated to the respective colors and read out (OUT-1–OUT3 in FIG. 10(b)).

In the present embodiment, in the horizontal transfer of the input charges in the horizontal registers 31–33, the phases of the clock pulses $\phi_1$, $\phi_2$ and $\phi_3$ to the registers 31, 32 and 33, respectively, are varied as shown in FIG. 10(b) so that the three color signals are produced at different phases, although the clock pulses $\phi_1$–$\phi_3$ may be in phase as shown by chain lines in FIG. 10(b) so that the three color signals are simultaneously produced. The manner of reading out the three color signals may be selected depending on the subsequent signal processing.

A further embodiment of the present invention is explained with reference to FIG. 11, which shows an improvement over the embodiment shown in FIGS. 8–10. In the present embodiment, the separating input section is formed by the last line of the memory part 2 and a portion of the separating input section is provided with the function of the isolate section 53 shown in FIGS. 8 and 9 so that the configuration is simplified.

Figure 11:
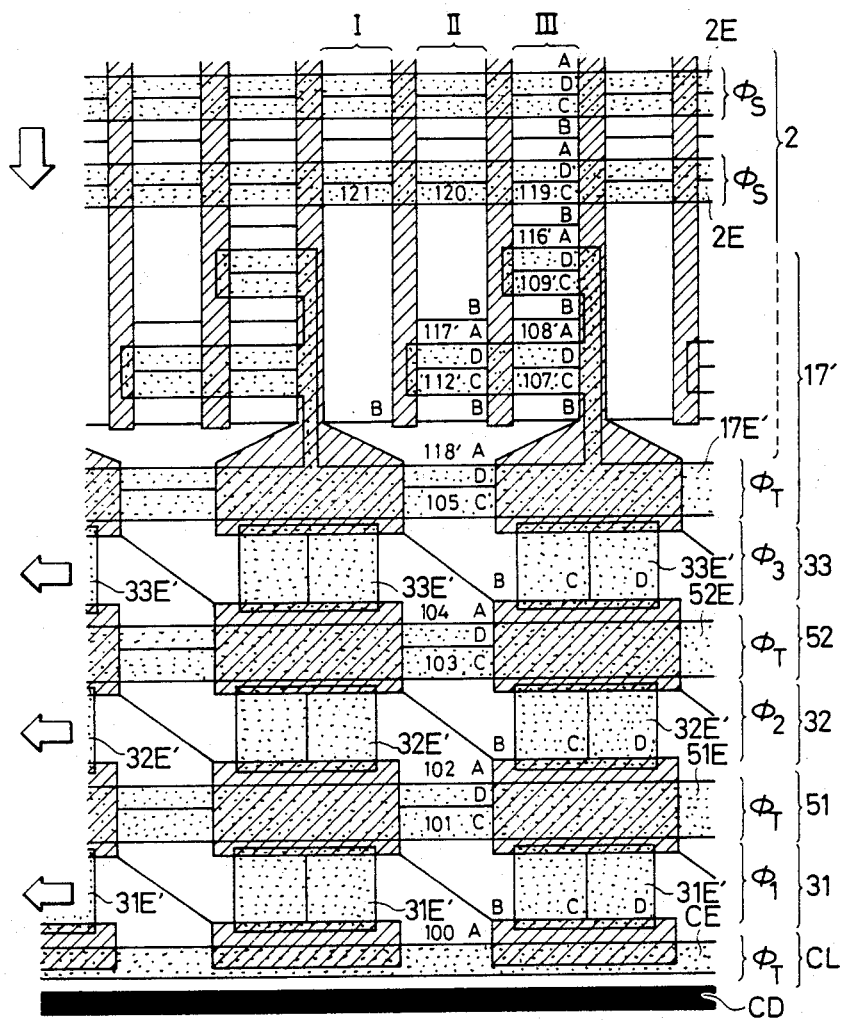
FIG. 11 shows a further embodiment of the present invention, shown in a similar manner to FIGS. 5 and 9.

Referring to FIG. 11, the like numerals to those shown in FIG. 9 designate the like elements and the like numerals with primes designate the like functional means.

Numeral 17' denotes a separating input section, and numeral 17E' denotes an electrode of the separating input section 17'. The clock pulse $\phi T$ is applied to the electrode 17E'. As shown, the separating input section 17' is formed by a region B of the last line of the memory part 2 and a portion of the separating input section 17' has a function of the isolate section to the memory part 2, for the horizontal register 33.

The other portions are identical to FIG. 9. In the arrangement described above, when the charges have been vertically transferred from the image sensing part 1 to the memory part 2 (corresponding to the time $t_2$ in FIG. 10(a)), the charges in the last line of the memory part 2 are distributed in the following manner. The charge in the column I is stored in a portion 118', the charge in the column II is stored in a portion 117' and the charge in the column III is stored in a portion 116'.

A read mode starts from the above status at the time $t_3$ of FIG. 10(b). When the clock pulse $\phi T$ is applied, the charge in the portion 118' of the column I of the memory part 2 is shifted to the portion 104 of the horizontal register 33 through the portion 105 of the separating input section 17', the charge in the portion 117' in the column II of the memory part 2 is shifted to the portion 118' of the memory part 2 through the portion 112' of the separating input section 17' and the charge in the portion 116' in the column III of the memory part 2 is shifted to the portion 108' of the separating input section 17' through the portion 109' of the separating input section 17'. When the second clock pulse $\phi T$ is applied, the charge in the portion 104 in the column I of the horizontal register 33 is shifted to the portion 102 of the horizontal register 32 through the portion 103 of the isolate section 52, the charge in the portion 118' in the column II of the memory part 2 is shifted to the portion 104 of the horizontal register 33 through the portion 105 of the separating input section 17', and the charge in the portion 108' in the column III of the separating input section 17' is shifted to the portion 118' of the memory part 2 through the portion 107' of the separating input section 17'. When the third clock pulse $\phi T$ is applied, the charge in the portion 102 of the horizontal register 32 in the column I is shifted to the portion 100 of the horizontal register 31 through the portion 101 of the isolate section 51, the charge in the column II in the portion 104 of the horizontal register 33 is shifted to the portion 102 of the horizontal register 32 through the portion 103 of the isolate section 52, and the charge in the column III in the portion 118' of the memory part 2 is shifted to the portion 104 of the horizontal register 33 through the portion 105 of the separating input section 17'.

In this manner, the information in the last line of the memory 2 is distributed to the horizontal registers 31–33. In the present embodiment, one line of information is distributed to the horizontal registers 31–33 with one fewer clock pulses than the embodiment of FIG. 9, that is, with three clock pulses $\phi T$. Accordingly, in the present embodiment, the number of clock pulses $\phi T$ applied is one fewer than that shown in FIG. 10(b). The waveforms of the clock pulses shown in FIG. 10(a) are also applicable to the present embodiment. The operation of the horizontal charge transfer after the distribution of the charges is the same as that in FIG. 9.

In the above three embodiments, the separating input sections 17 and 17' impart different amounts of delay to the respective groups of the memory part 2 such that they impart an effective delay of zero picture cells (corresponding to zero bits) to the information in the column I group of the memory part 2, an effective delay of one picture cell (corresponding to one bit) to the information in the column II group and an effective delay of two picture cells (corresponding to two bits) to the information in the column III group, in order to parallel-to-serial convert one line of information. The read-in of the horizontal registers 31–33 is controlled in synchronism with the serial outputs from the separating input sections 17 and 17' so that one line of information in the memory part 2 is read into the horizontal registers 31–33 by column group.

In the above embodiment, one horizontal line of information in the image sensing part 1 is divided into three parts, which are read out by the three horizontal registers 31–33. Thus, the number of bits of each of the horizontal registers 31–33 may be approximately one third of the number of horizontal picture cells of the image sensing part 1 and hence the frequency of the clock pulses $\phi_1$–$\phi_3$ applied to the horizontal registers 31–33 may be reduced by a factor of approximately three. As a result, the power consumption is saved, the noise is reduced and the transfer efficiency is improved. In the embodiments of FIGS. 8–11, the mixing of charges among the horizontal registers 31, 32 and 33 and the memory part 2 in the horizontal charge transfer mode is prevented by the isolate sections 51–53 or the isolate sections 51 and 52 and the separating input section 17' so that the read operation is well carried out.

While the frame transfer type two-dimensional CCD array has been specifically described, it should be understood that the present invention is equally applicable to an interline type two-dimensional CCD or CPD (charge priming device) array.

The horizontal registers serve to separately read in and read out the charges of the respective colors separated by the color separating optical members such as color separation filters. The color separation filter may be a combination of complementary color filters. Instead of the stripe color filter, a mosaic color filter may be used.

If the number of colors separated by the color separating optical member is larger than three, the number of horizontal registers may be more than three.

While the clear drain CD and the clear gate CL for clearing the unnecessary charges are provided in the present embodiment, the color information may be separated without them. The separating input section 17 for the horizontal registers 31–33 may be constructed by the gate electrode.

In accordance with the solid state imaging device of the present invention, the sample and hold circuit for separating the color signals is not necessary or can be extremely simplified and the mixing of the color information in reading out the color information is prevented and high quality of color information is provided. Since the read clock frequency in the horizontal read circuit is significantly lowered, a high transfer efficiency can be maintained even if the number of horizontal picture cells of the image sensing part is increased, that is, when horizontal resolution is increased. In addition, the noise is reduced and the power consumption is saved.

We claim:

1. A charge transfer device comprising:
   (A) a storage portion comprising a plurality of storage cells arrayed in at least one row, each cell for storing an electrical charge;
   (B) a converting portion for converting the electrical charges of one row of said storage portion into m serial groups of electrical charges, each group having 1/m of the electrical charges of the one row of said storage portion, where m is an integer no smaller than three;
   (C) a read-out portion comprising m read-out channels each for reading out one of said m groups of electrical charges; and
   (D) m gate portions provided between said converting portion and said read-out portion and between adjacent ones of said read-out channels in said read-out portion;
   wherein said converting portion and said m gate portions are controllable with a single control signal.

2. A charge transfer device according to claim 1, wherein said converting portion and said gate portions each have control electrodes to which the control signal is applied.

3. A charge transfer device according to claim 1, wherein one row of said storage portion includes n storage cells, where n is a multiple of m and said converting portion includes n/m parallel-to-serial converting sections each for converting m parallel electrical charges into m serial electrical charges, said converting sections being controllable with the control signal.

4. A charge transfer device according to claim 3, wherein each of said parallel-to-serial converting sections has m inputs and an output and includes m charge transfer channels each having a different amount of delay and being controllable with the control signal.

5. A charge transfer device according to claim 4, wherein said m charge transfer channels in one converting section each include a different number of charge transfer bits controllable with the control signal.

6. A charge transfer device comprising:
   (A) a storage portion comprising a plurality of storage cells arrayed in at least one row, each cell for storing an electrical charge;
   (B) a converting portion for converting the electrical charges of one row of said storage portion into m serial groups of electrical charges, each group having 1/m of the electrical charges of the one row of said storage portion, where m is an integer no smaller than three;
   (C) a read-out portion comprising m read-out channels each for reading out one of said m groups of electrical charges; and
   (D) a clear portion for extinguishing electrical charges, said clear portion being disposed along said read-out portion at the opposite side to said converting portion; and
   (E) (m+1) gate portions provided between said converting portion and said read-out portion, between adjacent ones of said read-out channels in said read-out portion, and between said read-out portion and said clear portion;
   wherein said converting portion and said (m+1) gate portions are controllable with a single control signal.

7. A charge transfer device according to claim 6, wherein said converting portion and said gate portions each have control electrodes to which the control signal is applied.

8. A charge transfer device according to claim 6, wherein one row of said storage portion includes n storage cells, where n is a multiple of m and said converting portion includes n/m parallel-to-serial converting sections each for converting m parallel electrical charges into m serial electrical charges, said converting sections being controllable with the control signal.

9. A charge transfer device according to claim 8, wherein each of said parallel-to-serial converting sections has m inputs and an output and includes m charge transfer channels respectively having different amounts of delay and being controllable with the control signal.

10. A charge transfer device according to claim 9, wherein said m charge transfer channels in one converting section respectively include different numbers of charge transfer bits controllable with the control signal.

11. A charge transfer device comprising:
    (A) a storage portion comprising a plurality of storage cells arrayed in at least one row, each cell for storing an electrical charge, said row including n storage cells, where n is an integer;
    (B) a converting portion for converting the electrical charges of one row of said storage portion into m serial groups of electrical charges, each group having 1/m of the electrical charges of the one row of said storage portion, where m is an integer no smaller than three and n is a multiple of m, said converting portion including n/m parallel-to-serial converting sections each for converting m parallel charges into m serial charges, each of said parallel-to-serial converting sections having m inputs and an output and including m different charge transfer channels each including a different number of charge transfer bits; and
    (C) a read-out portion arranged to separately read out said m groups of electrical charges of one row of said storage portion;
    wherein all the charge transfer bits in said converting portion are controllable with a single control signal.

12. A charge transfer device according to claim 11, wherein said read-out portion includes m read-out channels each for reading out one of said m groups of electrical charges.

13. A charge transfer device comprising:

(A) a storage portion including a plurality of storage cells each for storing an electrical charge, said storage cells being arrayed in at least one row, said one row being classified into a plurality of storage cell groups each including m adjacent storage cells, where m is an integer no smaller than three;

(B) (m−1) delay channels provided for each of said storage cell groups in said row of said storage portion, said delay channels being arranged to connect (m−1) storage cells to a remaining storage cell in each storage cell group and each having a different amount of delay; and (C) a read-out portion for reading out the electrical charges of one row of said storage portion, said read-out portion being arranged to receive said electrical charges through said remaining storage cell in each storage cell group in said row of said storage portion.

14. A charge transfer device according to claim 13, wherein all the delay channels are controllable with a single control signal.

15. A charge transfer device according to claim 13, wherein each of said (m−1) delay channels for each storage cell group includes a different number of charge transfer bits.

16. A charge transfer device according to claim 15, wherein all the charge transfer bits in said delay channels are controllable with a single control signal.

17. A charge transfer device according to claim 13, wherein said read-out portion is arranged to separately read out m groups of electrical charges of one row of said storage portion, said m groups of electrical charges being time-sharingly supplied from said storage portion through said remaining storage cell in each storage cell group in said row and each including a different 1/m of the electrical charges of one the row of said storage portion.

18. A charge transfer device according to claim 17, wherein said read-out portion includes m separate read-out channels each for reading out one of said m groups of electrical charges.

19. A charge transfer device according to claim 18, further comprising:
m gate portions provided between said storage portion and said read-out portion and between adjacent ones of said read-out channel in said read-out portion.

20. A charge transfer device according to claim 19, wherein said delay channels and said gate portions are controllable with a single control signal.

21. A charge transfer device according to claim 18, further comprising:
a clear portion for extinguishing electrical charges, said clear portion being disposed along said read-out portion at the opposite side to said storage portion; and
(m+1) gate portions provided between said storage portion and said read-out portion, between adjacent ones of said read-out channels in said read-out portion, and between said read-out portion and said clear portion.

22. A charge transfer device according to claim 21, wherein said delay channels and said gate portions are controllable with a single control signal.

23. An electrical charge processing system comprising in combination:

(A) storage means comprising a plurality of storage cells arrayed in at least one row, each cell for storing an electrical charge;

(B) converting means for converting the electrical charges of one row of said storage portion into m serial groups of electrical charges, each group having 1/m of the electrical charges of the one row of said storage portion, where m is an integer no smaller than three;

(C) read-out means comprising m read-out channels each for reading out one of said m groups of electrical charges; and (D) output means including m output amplifiers respectively connected to said m read-out channels in said read-out means for converting electrical charges into corresponding electrical signals;

(E) m gate means provided between said converting means and said read-out means and between adjacent ones of said read-out channels in said read-out means;
wherein said converting means and said m gate means are controllable with a single control signal;

(F) m separate signal processing circuit means respectively connected to said m output amplifiers in said output means for processing the electrical signals provided by said output means; and (G) drive means for driving at least said storage means, said converting means, said read-out means and said m gate means, said drive means producing a plurality of drive signals including the control signal.

24. A processing system according to claim 23, wherein one row of said storage means includes n storage cells, where n is a integer and is a multiple of m; and said converting means includes n/m parallel-to-serial converting sections each for converting m parallel electrical charges into m serial electrical charges, said converting sections being controllable with the control signal.

25. A processing system according to claim 24, wherein each of said parallel-to-serial converting sections has m inputs and an output and includes m charge transfer channels each having a different amount of delay and being controllable with the control signal.

26. A processing system according to claim 25, wherein each of said m charge transfer channels in one converting section includes a different number of charge transfer bits controllable with the control signal.

27. A processing system according to claim 23, further comprising:
clear means for extinguishing electrical charges, said clear means being disposed along said read-out means at the opposite side to said converting means; and
a clear gate provided between said read-out means and said clear means and being controllable with the control signal.

28. An electrical charge processing system comprising:

(A) storage means comprising a plurality of storage cells arrayed in at least one row, said one row including n storage cells, where n is an integer, each cell for storing an electrical charge;

(B) converting means for converting the electrical charges of one row of said storage means into m serial groups of electrical charges, each group having 1/m of the electrical charges of the one row of said storage means, where m is an integer no smaller than three and n is a multiple of m, said converting means including n/m parallel-to-serial converting sections each for converting m parallel charges to m serial charges, each of said parallel-to-serial converting sections having m inputs and an output and including m different charge transfer channels each including a different number of charge transfer bits;

wherein all the charge transfer bits in said converting means are controllable with a single control signal;

(C) read-out means arranged to separately read out said m groups of electrical charges of one row of said storage means;

(D) output means connected to said read-out means for converting the electrical charges into corresponding electrical signals;

(E) signal processing means connected to said output means for processing the electrical signals provided by said output means; and (F) drive means for driving at least said storage means, said converting means and said read-out means, said drive means producing a plurality of drive signals including the control signal.

29. An electrical charge processing system comprising:

(A) storage means including a plurality of storage cells arrayed in at least one row, said one row being classified into a plurality of storage cell groups each including m adjacent storage cells, where m is an integer no smaller than three, each cell for storing an electrical charge;

(B) (m−1) delay channels provided for each of said storage cell groups in said row of storage means, said delay channels being arranged to connect (m−1) storage cells to a remaining storage cell in each storage cell group and each having a different amount of delay;

(C) read-out means for reading out the electrical charges of one of said storage means through said remaining storage cell in each cell group in said row of said storage means;

(D) output means connected to said read-out means for converting the electrical charges into corresponding electrical signals;

(E) signal processing means connected to said output means for processing the electrical signals provided by said output means; and (F) drive means for driving at least said storage means, said (m−1) delay channels and said read-out means, said drive means producing a plurality of control signals.

30. A processing system according to claim 29, wherein all the delay channels are controllable with the same one of the plurality of control signals produced by said drive means.

31. A processing system according to claim 29, wherein each of said (m−1) delay channels for each storage cell group in said row of said storage means includes a different number of charge transfer bits.

32. A processing system according to claim 31, wherein all the charge transfer bits in said delay channels are controllable with the same one of the plurality of control signals produced by said drive means.

33. A processing system according to claim 29, wherein said read-out means is arranged to separately read out m groups of electrical charges of one row of said storage means, said m groups of electrical charges being time-sharingly supplied from the storage means through said remaining storage cell in each storage cell group in said row and each having a different 1/m of the electrical charges of the one row of said storage means.

34. A processing system according to claim 33, wherein said read-out means includes m separate read-out channels each for reading out one of said m groups of electrical charges; said output means includes m output amplifiers respectively connected to said m read-out channels for separately converting said m groups of electrical charges into m groups of corresponding electrical signals; and said signal processing means includes m signal processing circuits respectively connected to said m output amplifiers in said output means for processing said m groups of electrical signals separately.

35. A processing system according to claim 34, further comprising:

m gate means provided between said storage means and said read-out means and between adjacent ones of said read-out channels in said read-out means.

36. A processing system according to claim 35, wherein said delay channels and said gate means are controllable with the same one of the plurality of control signals produced by said drive means.

37. A processing system according to claim 34, further comprising:

clear means for extinguishing electrical charges, said clear means being disposed along said read-out means at the opposite side to said storage means; and (m+1) gate means provided between said storage means and said read-out means, between adjacent ones of said read-out channels in said read-out means, and between said read-out means and said clear means.

38. A processing system according to claim 37, wherein said delay channels and said gate means are controllable with the same out of the plurality of control signals produced by said drive means.

39. A charge transfer type solid-state image pick-up device comprising:

(A) an image sensing portion including a plurality of sensing cells arrayed in rows and columns, each cell for producing an electrical charge in response to received radiation;

(B) a storage portion including a plurality of storage cells arrayed in like rows and columns for storing the electrical charges produced by said sensing portion;

(C) a converting portion for converting the electrical charges of one row of said storage portion into m serial groups of electrical charges, each group having 1/m of the electrical charges of the one row of said storage portion, where m is an integer no smaller than three;

(D) a read-out portion including m read-out channels each for reading out one group of electrical charges of one row of said storage portion through said converting portion;

(E) an output portion including m separate output sections respectively connected to said m read-out channels in said read-out portion for separately converting said m groups of electrical charges into m groups of corresponding electrical signals; and (F) m gate portions provided between said converting portion and said read-out portion and between adjacent ones of said read-out channels in said read-out portion;

wherein said converting portion and said gate portions are controllable with a single control signal.

40. An image pick-up device according to claim 39, wherein one row of said storage portion includes n storage cells, where n is an integer and is a multiple of m; and said converting portion includes n/m parallel-to-serial converting sections each for converting m parallel electrical charges into m serial electrical charges, said converting sections being controllable with the control signal.

41. An image pick-up device according to claim 40, wherein each of said parallel-to-serial converting section has m inputs and an output and includes m charge transfer channels each having a different amount of delay and being controllable with the control signal.

42. An image pick-up device according to claim 41, wherein each of said m charge transfer channels in one converting section includes a different number of charge transfer bits controllable with the control signal.

43. An image pick-up device according to claim 39, further comprising:
a clear portion for extinguishing electrical charges, said clear portion being disposed along said read-out portion at the opposite side to said converting portion; and
a clear gate provided between said read-out portion and said clear portion and controllable with the control signal.

44. A charge transfer type solid-state image pick-up device comprising:
(A) an image sensing portion including a plurality of sensing cells arrayed in rows and columns, each cell for producing an electrical charge in response to received radiation;
(B) a storage portion including a plurality of storage cells arrayed in like rows and columns, each of said rows including n storage cells, where n is an integer, for storing the electrical charges produced by said sensing portion;
(C) a converting portion for converting the electrical charges of one row of said storage portion into m serial groups of electrical charges, each group having 1/m of the electrical charges of the one row of said storage portion, where m is an integer no smaller than three and n is a multiple of m, said converting portion including n/m parallel-to-serial converting sections each for converting m parallel charges into m serial charges, each of said parallel-to-serial converting sections having m inputs and an output and including m different charge transfer channels each including a different number of charge transfer bits;
(D) a read-out portion to separately read out said m groups of electrical charges of one row of said storage portion through said converting portion; and
(E) an output portion connected to said read-out portion for converting said m groups of electrical charges into m groups of corresponding electrical signals;
wherein all the charge transfer bits in said converting portion are controllable with a single control signal.

45. A charge transfer type solid-state image pick-up device comprising:
(A) an image sensing portion including a plurality of sensing cells arrayed in rows and columns, each cell for producing an electrical charge in response to received radiation;
(B) a storage portion, including a plurality of storage cells arrayed in like rows and columns, wherein the last row of storage cells is classified into a plurality of storage cell groups each including m adjacent storage cells, where m is an integer no smaller than three for storing the electrical charges produced by said sensing portion;
(C) (m−1) delay channels provided for each of said storage cell groups in said last row of said storage portion, said delay channels being arranged to connect (m−1) storage cells to a remaining storage cell in each storage cell group and each having a different amount of delay;
(D) a read-out portion for reading out the electrical charges of one row of said storage portion, said read-out portion being arranged to receive said electrical charges through said remaining storage cell in each storage cell group in said last row of said storage portion; and
(E) an output portion connected to said read-out portion for converting said m groups of electrical charges into m groups of corresponding electrical signals.

46. An image pick-up device according to claim 45, wherein all the delay channels are controllable with a single control signal.

47. An image pick-up device according to claim 45, wherein each of said (m−1) delay channels for each storage cell group includes a different number of charge transfer bits.

48. An image pick-up device according to claim 47, wherein all the charge transfer bits in said delay channels are controllable with a single control signal.

49. An image pick-up device according to claim 45, wherein said read-out portion is arranged to separately read out m groups of electrical charges of one row of said storage portion, said m groups of electrical charges being time-sharingly supplied from said storage portion through said remaining storage cell in each storage cell group in said row and each including a different 1/m of the electrical charges of the one row of said storage portion.

50. An image pick-up device according to claim 49, wherein said read-out portion includes m separate read-out channels each for reading out one of said m groups of electrical charges.

51. An image pick-up device according to claim 50, further comprising:
m gate portions provided between said storage portion and said read-out portion and between adjacent ones of said read-out channels in said read-out portion.

52. An image pick-up device according to claim 51, wherein said delay channels and said gate portions are controllable with a single control signal.

53. An image pick-up device according to claim 50, further comprising:
a clear portion for extinguishing electrical charges, said clear portion being disposed along said read-out portion at the opposite side to said storage portion; and
(m+1) gate portions provided between said storage portion and said read-out portion, between adjacent ones of said read-out channels in said read-out portion, and between said read-out portion and said clear portion.

54. An image pick-up device according to claim 53, wherein said delay channels and said gate portions are controllable with a single control signal.

55. A color image pick-up system comprising:
(A) image sensing means including a plurality of sensing cells each for producing an electrical charge in response to received light, said sensing cells being arrayed in rows and columns, said columns being classified into a plurality of column groups each including m adjacent columns, where m is an integer no smaller than three;
(B) storage means including a plurality of storage cells arrayed in like rows and columns for storing the electrical charges produced by said sensing means;
(C) converting means for converting the electrical charges of one row of said storage means into m serial groups of electrical charges, each group including 1/m of the electrical charges of the one row of said storage means and respectively comprising the electrical charges from each kth column (k=1, 2, . . . , m) of the column groups of said image sensing means;
(D) read-out means including m read-out channels each for reading out one of said m groups of electrical charges of one row of said storage means through said converting means;
(E) output means including m separate output amplifiers respectively connected to said m read-out channels in said read-out means for separately converting said m groups of signals;
(F) m gate means respectively provided between said converting means and said read-out means and between adjacent ones of said read-out channels in said read-out means;
wherein said converting means and said gate means are controllable with a single control signal;
(G) color filter means disposed in front of said image sensing means for separating the light into a plurality of colored light components such that each kth column (k=1, 2, . . . , m) of the column groups of said sensing means receives the same color light;
(H) signal processing means connected to said output means for processing said electrical signals into a luminance signal and plural color signals; and
(I) drive means for driving at least said image sensing means, said storage means, said converting means, said read-out means, and said gate means, said drive means producing a plurality of drive signals including the control signal.

56. A system according to claim 55, further comprising:
clear means for extinguishing electrical charges, said clear means being disposed along said read-out means at the opposite side to said converting means; and
a clear gate provided between said read-out means and said clear means and being controllable with the control signal.

57. A color image pick-up system comprising:
(A) image sensing means including a plurality of sensing cells each for producing an electrical charge in response to received light, said sensing cells being arrayed in rows and n columns, said columns being classified into n/m column groups each including m adjacent columns, where m is an integer no smaller than three and n is a multiple of m;
(B) storage means including a plurality of storage cells arrayed in like rows and columns for storing the electrical charges produced by said sensing means;
(C) converting means for converting the electrical charges of one row of said storage means into m serial groups of electrical charges, each group including 1/m of the electrical charges of the one row of said storage means and respectively comprising the electrical charges from each kth column (k=1, 2, . . . , m) of the column groups of said image sensing means, said converting means including n/m parallel-to-serial converting sections each for converting m adjacent parallel charges into m serial charges, each of said parallel-to-serial converting sections having m inputs and an output and including m different charge transfer channels each including a different number of charge transfer bits;
(D) read-out means to separately read out said m groups of electrical charges of one row of said storage means through said converting means;
(E) output means connected to said read-out means for converting said m groups of electrical into m groups of corresponding electrical signals;
wherein all the charge transfer bits in said converting means are controllable with a single controls signal;
(F) color filter means disposed in front of said image sensing means for separating the light into a plurality of colored light components such that each kth column (k=1, 2, . . . , m) of the column groups of said sensing means receives light having the same color;
(G) signal processing means connected to said output means for processing said electrical signals into a luminance signal and plural color signals; and
(H) drive means for driving at least said image sensing means, said storage means, said converting means, and said read-out means, said drive means producing a plurality of drive signals including the control signal.

58. A system according to claim 57, wherein said read-out means includes m separate read-out channels each for reading out one of said m groups of electrical charges; said output means includes m output amplifiers respectively connected to said m read-out channels for separately converting said m groups of electrical charges into m groups of corresponding electrical signals; and said signal processing means includes m signal processing circuits respectively connected to said m output amplifiers in said output means for processing said m groups of electrical signals separately.

59. A system according to claim 58, further comprising:
m gate means provided between said converting means and said read-out means and between adjacent ones of said read-out channels in said read-out means.

60. A system according to claim 58, further comprising:
clear means for extinguishing electrical charges, said clear means being disposed along said read-out means at the opposite side to said converting means; and
(m+1) gate means provided between said converting means and said read-out means, between adjacent ones of said read-out channels in said read-out means, and between said read-out means and said clear means.

61. A color image pick-up system comprising:
(A) image sensing means including a plurality of sensing cells each for producing an electrical charge in response to received light, said sensing cells being arrayed in rows and columns;
(B) storage means including a plurality of storage cells arrayed in like rows and columns, wherein the last row of storage cells is classified into a plurality of storage cell groups each including m adjacent storage cells, where m is an integer no smaller than three, for storing the electrical charges produced by said sensing means;
(C) (m−1) delay channels provided for each of said storage cell groups in said last row of said storage means, said delay channels being arranged to connect (m−1) storage cells to a remaining storage cell in each storage cell group and each having a different amount of delay;
(D) read-out means for reading out the electrical charges of one row of said storage means, said read-out means being arranged to receive said electrical charges through said remaining storage cell in each storage group in said last row of said storage means;
(E) output means connected to said read-out means for converting said m groups of electrical charges into m groups of corresponding electrical signals;
(F) color filter means disposed in front of said image sensing means for separating the light into a plurality of colored light components such that each kth column (k=1, 2, . . . , m) of the column groups of said sensing means receives the same color light;
(G) signal processing means connected to said output means for processing said electrical signals into a luminance signal and plural color signals; and
(H) drive means for driving at least said image sensing means, said storage means, said delay channels, and said read-out means, said drive means producing a plurality of drive signals including a control signal.

62. A system according to claim 61, wherein said read-out means includes m separate read-out channels each for reading out one of said m groups of electrical charges; said output means includes m output amplifiers respectively connected to said m read-out channels for separately converting said m groups of electrical charges into m groups of corresponding electrical signals; and said signal processing means includes m signal processing circuits respectively connected to said m output amplifiers in said output means for processing said m groups of electrical signals separately.

63. A system according to claim 62, further comprising:
m gate means provided between said storage means and said read-out means and between adjacent one of said read-out channels in said read-out means.

64. A system according to claim 63, wherein said delay channels and said gate means are controllable with the control signal produced by said drive means.

65. A system according to claim 62, further comprising:
clear means for extinguishing electrical charges, said clear means being disposed along said read-out means at the opposite side to said storage means; and
(m+1) gate means provided between said storage and said read-out means, between adjacent ones of said read-out channels in said read-out means, and between said read-out means and said clear means.

66. A system according to claim 65, wherein said delay channels and said gate means are controllable with the control signal produced by said drive means.

* * * * *